(12) United States Patent
Okita et al.

(10) Patent No.: US 10,714,356 B2
(45) Date of Patent: Jul. 14, 2020

(54) PLASMA PROCESSING METHOD (71) Applicant: Panasonic Intellectual Property Management Co., Ltd., Osaka (JP)

(72) Inventors: Shogo Okita, Hyogo (JP); Atsushi Harikai, Osaka (JP); Akihiro Itou, Kyoto (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 2 days.

(21) Appl. No.: 16/154,930

(22) Filed: Oct. 9, 2018

(65) Prior Publication Data

US 2019/0122892 A1  Apr. 25, 2019

(30) Foreign Application Priority Data

Oct. 20, 2017 (JP) .................. 2017-203058

(51) Int. Cl.
| | |
|---|---|
| *H01L 21/306* | (2006.01) |
| *H01L 21/3065* | (2006.01) |
| *H01L 21/67* | (2006.01) |
| *H01L 21/683* | (2006.01) |
| *H01L 21/677* | (2006.01) |
| *H01L 21/687* | (2006.01) |
| *H01L 21/311* | (2006.01) |
| *H01J 37/00* | (2006.01) |

(52) U.S. Cl.
CPC ........ *H01L 21/30655* (2013.01); *H01J 37/00* (2013.01); *H01L 21/31116* (2013.01); *H01L 21/67069* (2013.01); *H01L 21/67109* (2013.01); *H01L 21/67739* (2013.01); *H01L 21/6831* (2013.01); *H01L 21/68735* (2013.01); *H01L 21/68742* (2013.01)

(58) Field of Classification Search
CPC ......... H01L 21/30655; H01L 21/67109; H01L 21/68735; H01L 21/31116; H01L 21/68742; H01L 21/67739; H01L 21/6831; H01L 21/67069; H01J 37/00
See application file for complete search history.

(56) References Cited

U.S. PATENT DOCUMENTS

| | | | |
|---|---|---|---|
| 8,802,545 B2 | 8/2014 | Johnson et al. | |
| 2010/0216313 A1* | 8/2010 | Iwai ................. | H01J 37/32623 438/729 |

(Continued)

FOREIGN PATENT DOCUMENTS

JP  2014-513868 A   6/2014

*Primary Examiner* — Duy Vu N Deo
(74) *Attorney, Agent, or Firm* — Pearne & Gordon LLP (57) ABSTRACT

Provided is a plasma processing method which comprises steps of preparing a conveying carrier including a holding sheet and a frame provided on a peripheral region of the holding sheet, adhering the substrate on the holding sheet in an inner region inside the peripheral region to hold the substrate on the conveying carrier, sagging the holding sheet in the inner region, setting the conveying carrier on a stage provided within a plasma processing apparatus to contact the holding sheet on the stage so that the holding sheet in the inner region touches the stage before the holding sheet in the peripheral region does, and plasma processing the substrate.

7 Claims, 5 Drawing Sheets

(56) References Cited

U.S. PATENT DOCUMENTS

2012/0021608 A1* 1/2012 Arita .................. H01L 21/6835
                                                            438/703
2014/0109941 A1* 4/2014 Miyanari .......... H01L 21/67132
                                                            134/157

* cited by examiner

PLASMA PROCESSING METHOD

CROSS REFERENCE TO RELATED APPLICATION

The present application is based on and claims priority under 35 U.S.C. § 119 with respect to the Japanese Patent Application No. 2017-203058 filed on Oct. 20, 2017 of which entire content is incorporated herein by reference into the present application.

TECHNICAL FIELD

The present invention relates to a method for plasma processing a substrate held on a holding sheet.

BACKGROUND

One of processes for dicing the substrate is known as a plasma dicing process which achieves plasma-etching the substrate with a mask thereon so as to divide it into a plurality of individual chips. Patent Document 1 (JP 2014-513868 A or U.S. Pat. No. 8,802,545 B2) discloses the method for plasma processing the substrate, in which the substrate is held on a conveying carrier that includes a holding sheet and a frame adhered on a periphery thereof and the substrate is set on a stage provided within a plasma processing apparatus, for ease of the handling of the substrate during delivery thereof.

Although the frame is designed to typically have a flat surface, the flatness thereof may be insufficient due to deviation and/or tolerance in manufacturing thereof and wear by repeated use in a production line. The insufficient flatness of the frame likely crimps the holding sheet adhered thereon.

The plasma treatment is carried out while the conveying carrier is set on and contacted on the stage by an electrostatic chucking mechanism called as an electrostatic chuck. The electrostatic chucking mechanism pulls or sticks the holding sheet onto the stage by means of the coulomb force or Johnson-Rahbek force between the Electrostatic Chuck electrode (referred to as ESC electrode) provided within the stage and the holding sheet, upon application of voltage with the ESC electrode. The crimps on the holding sheet may cause it pulled or stuck on the stage with a portion raised from the stage. This causes an insufficient contact between the stage and the sheet holding the substrate. The thinner substrate makes the contact therebetween further insufficient, because the lighter weight of the substrate can less effectively spread the crimps on the holding sheet.

The insufficient contact between the stage and the sheet holding the substrate distorts a plasma sheath generated at an interface between the substrate and the plasma atmosphere so that the substrate is unevenly etched, and therefore causing variation of the processed configuration and/or generation of unprocessed portions. Also, the insufficient contact may cause a temperature of the substrate raised at local regions and/or an abnormal discharge. The raised temperature and the abnormal discharge may damage the ESC electrode as well as the substrate and the holding sheet, which eventually deteriorates the production yield of the element chips obtained by the plasma processing method.

SUMMARY

One aspect of the present inventions relates to a plasma processing method, which comprises steps of preparing a conveying carrier including a holding sheet and a frame provided on a peripheral region of the holding sheet, adhering the substrate on the holding sheet in an inner region inside the peripheral region to hold the substrate on the conveying carrier, sagging the holding sheet in the inner region, setting the conveying carrier on a stage provided within a plasma processing apparatus to contact the holding sheet on the stage so that the holding sheet in the inner region touches the stage before the holding sheet in the peripheral region does, and plasma processing the substrate.

Another aspect of the present inventions relates to a plasma processing method, which comprises steps of preparing a conveying carrier including a holding sheet and an annular frame provided on a peripheral region of the holding sheet, by applying the frame with a biasing force in a radial direction for stretching it, adhering the frame on the holding sheet in the peripheral region thereof, and releasing the biasing force from the frame, so as to sag the holding sheet in an inner region inside the peripheral region, adhering the substrate on the holding sheet in the inner region to hold the substrate on the conveying carrier, setting the conveying carrier on a stage provided within a plasma processing apparatus to contact the holding sheet on the stage so that the holding sheet in the inner region touches the stage before the holding sheet in the peripheral region does, and plasma processing the substrate.

DETAILED DESCRIPTION

A plasma processing method according to one embodiment of the present invention comprises a step (preparing step) for preparing a conveying carrier including a holding sheet and a frame provided on a peripheral region of the holding sheet, a step (substrate holding step) for adhering the substrate on the holding sheet in an inner region inside the peripheral region to hold the substrate on the conveying carrier, a step (sagging step) for sagging the holding sheet in the inner region, a step (setting step) for setting the conveying carrier on a stage provided within a plasma processing apparatus to contact the holding sheet on the stage so that the holding sheet in the inner region touches the stage before the holding sheet in the peripheral region does, and a step (plasma processing step) for plasma processing the substrate.

A plasma processing method according to another embodiment of the present invention comprises a step (preparing step) for preparing a conveying carrier including a holding sheet and an annular frame provided on a peripheral region of the holding sheet, by applying the frame with a biasing force in a radial direction for stretching it, adhering the frame on the holding sheet in the peripheral region thereof, and releasing the biasing force from the frame, so as to sag the holding sheet in an inner region inside the peripheral region, a step (substrate holding step) for adhering the substrate on the holding sheet in the inner region to hold the substrate on the conveying carrier, a step (setting step) for setting the conveying carrier on a stage provided within a plasma processing apparatus to contact the holding sheet on the stage so that the holding sheet in the inner region touches the stage before the holding sheet in the peripheral region does, and a step (plasma processing step) for plasma processing the substrate.

Prior to the setting step, the holding sheet in the inner region is sagged to have a sag amount Q. This allows, at the beginning of the setting step, the holding sheet in the inner region (typically at the center thereof) touches the stage before the holding sheet in the peripheral region touches the stage. Thus, contacting or touching of the holding sheet on the stage is initiated in the inner region (e.g., at the center) of the holding sheet, and a contacting or touching area of the holding sheet is gradually expanded from the inner region to the peripheral region, so that the holding sheet is set on the stage without crimps even if the frame has insufficient flatness. Therefore, according to the present embodiments of the invention, the production yield of the element chips obtained by the plasma processing method is improved.

Now, with reference to attached drawings, a couple of embodiments according to the present invention will be described hereinafter. Components performing the same functions are conveniently denoted with the same reference numerals throughout the drawings.

Figure 1A:
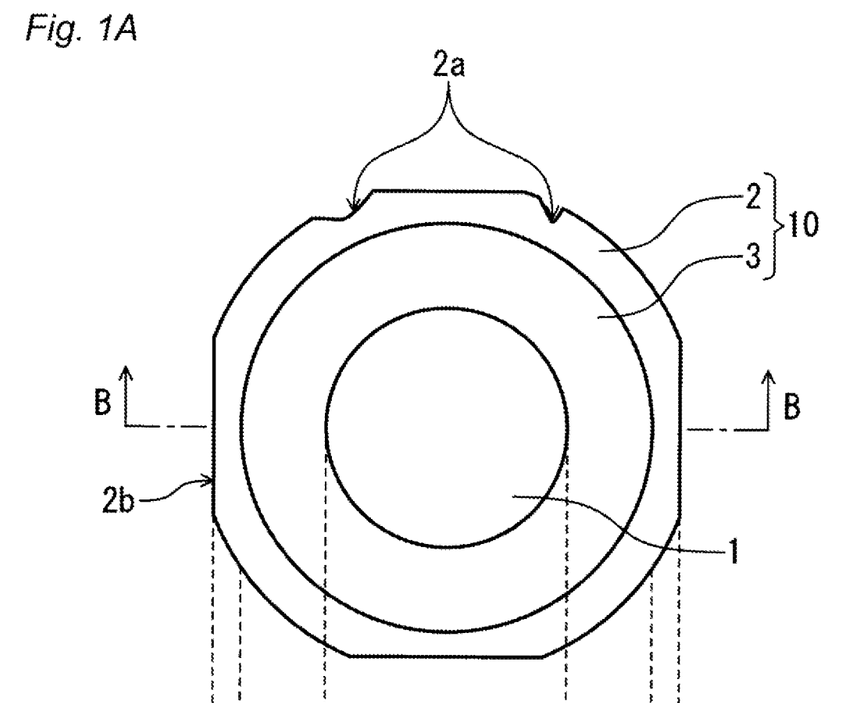
FIG. 1A is a top plan view schematically depicting a conveying carrier holding a substrate according to an embodiment of the present invention.
Figure 1B:
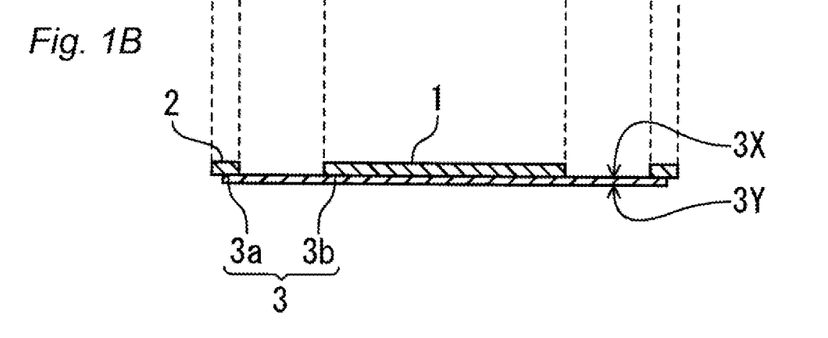
FIG. 1B is a cross-sectional view taken along a B-B line.

Firstly, referring to FIGS. 1A and 1B, one embodiment of a conveying carrier will be described hereinafter. FIG. 1A is a top plan view schematically depicting a conveying carrier 10 holding a substrate according to one embodiment of the present invention, and FIG. 1B is a cross-sectional view taken along a B-B line of FIG. 1A, illustrating the conveying carrier 10 prior to a sagging step.

As depicted in FIG. 1A, the conveying carrier 10 includes a frame 2 and a holding sheet 3. The frame 2 is held on the holding sheet 3 at the peripheral region 3a thereof. The substrate 1 is adhered on an inner region 3b of the holding sheet 3 to be held on the conveying carrier 10. Thus, the peripheral region 3a is a portion of the holding sheet 3 where it overlaps the frame 2. It should be noted that although FIG. 1 shows the substrate 1 and the frame 2 both having a circular shape, the shape is not limited thereto.

[Substrate]

The substrate 1 is an object to be plasma processed. The substrate 1 may be obtained, for example, by forming on one side of the main body, a circuit layer containing semiconductor circuits, electrical component elements and MEMSs, and then grinding the other side of the main body opposite the circuit layer to make it thinner. The semiconductor 1 is individualized or diced into a plurality of electronic components including the circuit layer (not shown).

The size of the substrate 1 is not limited to a particular one, and the maximum diameter thereof may be in a range about between 50 nm and 300 nm. The thickness of the substrate 1 is rather thin, typically about between 25 μm and 150 μm. Thus, the substrate 1 itself has little rigidity (self-support capability). The holding sheet 3 adheres the frame 2 at the peripheral region 3a and the substrate 1 on the inner region 3b. This makes easier to handle the substrate 1, for example, for transferring or delivering the substrate between subsequent operation steps. Although not limited thereto, the shape of the substrate 1 may be, for example, circular or rectangular. The substrate 1 may be provided with an orientation flat and/or a notch (not shown).

Although not limited thereto, the material of the main body of the substrate 1 may be, for example, semiconductor, dielectric, metal, or stacked layer of a combination thereof. The semiconductor material may contain, for example, silicon (Si), gallium arsenide (GaAs), gallium nitride (GaN), or silicon carbide (SiC). The dielectric layer may be made of, for example, resin such as polyimide, low-dielectric (low-k) material, silicon dioxide ($SiO_2$), silicon nitride ($Si_3N_4$), lithium tantalate ($LiTaO_3$), or lithium niobate ($LiNbO_3$).

The substrate 1 has a mask (not shown) having a predetermined pattern on one side (top side) opposite the other side (bottom side) on which the holding sheet 3 is adhered. The masked regions of the substrate 1 are protected from being etched by plasma exposure. The uncovered regions of the substrate 1 may be etched from the top side to the bottom side by plasma exposure. The mask may be a resist mask which is formed by exposing and developing a resist layer. Also, the mask may be formed by laser scribing either one of a dielectric layer such as silicon dioxide ($SiO_2$) and silicon nitride ($Si_3N_4$) laminated on the top side of the substrate 1, a resin layer containing polyimide, polybenzoxazole (PBO) and a resin film, so as to make the predetermined pattern (apertures) thereon.

[Frame]

The frame 2 is provided with an opening which has an area equal to or greater than that of the whole substrate 1, a predetermined width, and a substantially constant and small thickness. The frame 2 has a rigidity such that it can be transferred or delivered with the holding sheet 3 and the substrate 1 adhered thereon.

Although not limited thereto, the shape of the opening of the frame 2 may be, for example, circular, rectangular, and polygonal such as hexagonal. The frame 2 may be provided with a notch 2a and/or a corner cut 2b for alignment thereof. The frame 2 may be formed of material including, for example, metal such as aluminum and stainless steel, or a resin. The bottom side of the frame 2 is adhered on the top side of the holding sheet 3 at the peripheral region 3a thereof.

[Holding Sheet]

The holding sheet 3 includes an adhesive side 3X having an adhesive compound and a non-adhesive side 3Y having no adhesive compound. The adhesive side 3X adheres the bottom side of the frame 2, and covers the opening of the frame 2. The substrate 1 is adhered on the adhesive side 3X of the holding sheet 3 in the opening of the frame 2 corresponding to the inner region 3b.

The adhesive side 3X may preferably contain an adhesive material of which adhesibility is weakened with an ultraviolet beam (UV-radiation). This allows each of diced substrates (electric components) or element chips obtained by the plasma dicing step in order to easily be peeled off and picked up from the adhesive side 3X through the UV-radiation. The holding sheet 3 may be formed, for example, by applying an UV-curing acrylic adhesive having a thickness of 5-20 μm on one side of a film-shaped backing member.

Although not limited thereto, the material of the film-shaped backing member may be a thermoplastic resin including, for example, polyolefin such as polyethylene and polypropylene and polyester such as polyethylene terephthalate. The backing member may contain various additives including, for example, a rubber component for adding stretching property (for example, ethylene-propylene rubber (EPM), ethylene-propylene-diene rubber (EPDM)), a plasticizer, a softener, an antioxidant, and a conductive material. Furthermore, the thermoplastic resin may contain a functional group showing a photopolymerization reaction such as an acryl group. The backing member may have a thickness, for example, between 50-150 µm. The conveying carrier 10 is set on the stage so that the non-adhesive side 3Y of the holding sheet 3 is in contact with the stage.

[Plasma Processing Apparatus]

Figure 2:
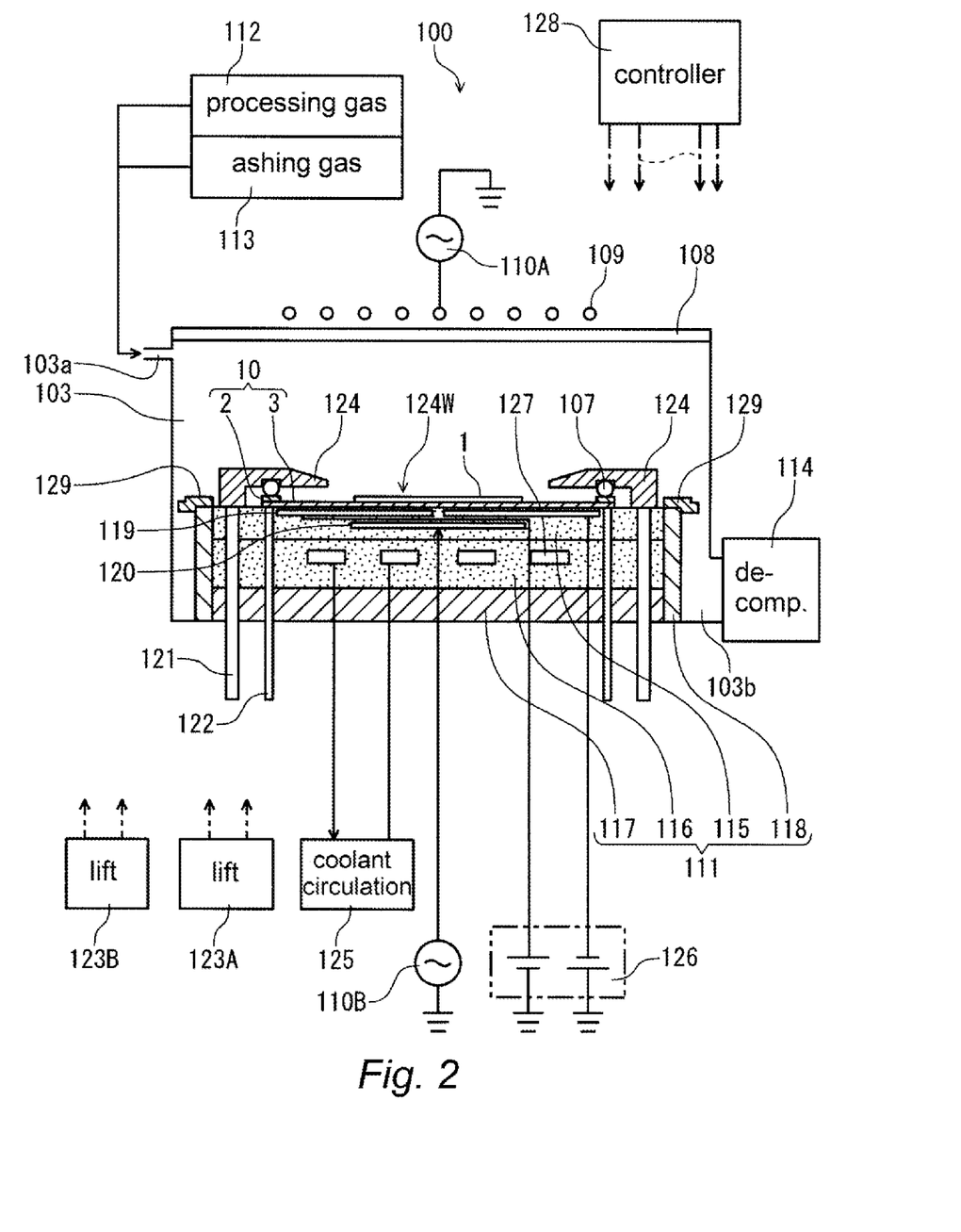
FIG. 2 is a conceptual cross-sectional view depicting a basic structure of a plasma processing apparatus according to the embodiment of the present invention.

Next, referring to FIG. 2, a plasma processing apparatus 100 used in a plasma dicing method according to the embodiment of the present invention will be described in detail hereinafter. FIG. 2 depicts a schematic structure in a cross section of the plasma processing apparatus 100.

The plasma processing apparatus 100 includes a stage 111, on which the conveying carrier 20 is set so that the adhesive side adhering the substrate 1 faces upwardly. The stage 111 has such a size that the whole conveying carrier 10 can be seated thereon. Arranged over the stage 111 is a cover 124 which covers at least a portion of the frame 2 and the holding sheet 3 and includes a window 124W exposing at least a portion of the substrate 1. The cover 124 is provided with a biasing member 107 for biasing the frame 2 downward when the frame 2 is set on the stage 111. The biasing member 107 may preferably be a component for achieving a point contact with the frame 2 such as a coil spring and an elastic resin. This restricts a thermal communication between the frame 2 and the cover 124, and also allows correcting a distortion of the frame 2.

The stage 111 and the cover 124 are received in a reaction chamber (vacuum chamber) 103. The vacuum chamber 103 is shaped in a substantially cylindrical configuration having an opening at the top thereof, which is closed by a dielectric member 108 formed as a lid of the vacuum chamber 103. The vacuum chamber 103 may be formed of aluminum, stainless steel (SUS), or aluminum with anodic oxide coating, for example. The dielectric member 108 may be formed of yttrium oxide ($Y_2O_3$), aluminum nitride (AlN), alumina ($Al_2O_3$), or quartz ($SiO_2$), for example. Arranged on or above the dielectric member 108 is a top or first electrode 109. The first electrode 109 is electrically connected to a first high-frequency power source 110A. The stage 111 is positioned at the bottom side in the vacuum chamber 103.

The vacuum chamber 103 is provided with a gas inlet 103a for introducing a gas and a gas outlet 103b for exhausting the gas. The gas inlet 103a is configured to be connected selectively to one of a material gas source such as a processing gas source 112 and an ashing gas source 113 each through a conduit. The outlet 103b is connected to a decompressing mechanism 114 having a vacuum pump for exhausting a gas within the vacuum chamber 103 and decompressing it. While the vacuum chamber 103 is supplied with the processing gas, the first electrode 109 is applied with a high-frequency power from the first power source 110A so as to generate the plasma atmosphere within the chamber 103.

The stage 111 includes an electrode layer 115, a metal layer 116, and a base member 117 supporting the electrode layer 115 and the metal layer 116, each having a substantially circular shape. The stage 111 also includes a peripheral member 118 surrounding the electrode layer 115, the metal layer 116, and the base member 117. The peripheral member 118 is formed of a metal having a conductivity and an etching resistance for protecting the electrode layer 115, the metal layer 116, and the base member 117 from the plasma exposure. Provided on an upper surface of the peripheral member 118 is an annular circumferential ring 129 for protecting it from the plasma exposure. The electrode layer 115 and the circumferential ring 129 may be formed of the dielectric material as listed above.

Arranged within the electrode layer 115 are a first or electrostatic chuck (ESC) electrode 119 and a second electrode 120 connected to a second high-frequency power source 110B. The ESC electrode 119 is electrically connected to a DC power source 126. The electrostatic chucking mechanism is composed of the ESC electrode 119 and the DC power source 126. The holding sheet 3 is pulled on and secured to the stage 111 by means of the electrostatic chucking mechanism. Although this embodiment describes the electrostatic chucking mechanism as an example of the securing mechanism for securing the holding sheet 3 to the stage 111, the securing mechanism is not limited thereto. Alternatively, the securing mechanism for securing the holding sheet 3 to the stage 111 may be performed by a clamp (not shown).

The metal layer 116 may be formed of aluminum with an anodic oxidation coating, for example. The metal layer 116 contains a coolant channel 127 configured to cool the stage 111. The holding sheet 3 seated on the stage 111 is cooled down by cooling the stage 111. Also, the cover 124 whose portion contacts with the stage 111 is also cooled down. This protects the substrate 1 and the holding sheet 3 from being damaged due to a heat applied during the plasma processing step. A coolant in the coolant channel 127 is circulated by a coolant circulation apparatus 125.

Provided around the peripheral portion of the stage 111 is a plurality of supporting members 122 extending therethrough. Each of the supporting members 122 supports the frame 2. The supporting members 122 are driven by a lifting mechanism 123A to move upward and downward. The conveying carrier 10 is delivered into the vacuum chamber 103, and passed on the supporting members 122 which has been raised at a given level. Then the supporting members 122 are lowered with the top surface being flush with or lower than the stage 111, which sets the conveying carrier 10 on the stage 111 at a predetermined position thereof.

Also, a plurality of lifting rods 121 are coupled to the peripheral edge of the cover 124 for moving it upward and downward. The lifting rods 121 are driven by another lifting mechanism 123B. The operation of the lifting mechanisms 123A, 123B can be controlled independently each other.

The controller 128 is adapted to control operations of the plasma processing apparatus 100 which includes the first high-frequency power source 110A, the second high-frequency power source 110B, the processing gas source 112, the ashing gas source 113, the decompressing mechanism 114, the coolant circulation apparatus 125, the lifting mechanisms 123A, 123B, and the electrostatic chucking mechanism.

Next, the plasma processing method according to first and second embodiments will be described in detail hereinafter. In the plasma processing method of the first embodiment, the holding sheet in the inner region is sagged in the preparing step, in particular, by applying the frame with the biasing force in the radial direction for stretching it, adhering the frame on the holding sheet in the peripheral region thereof, and releasing the biasing force from the frame.

In the plasma processing method of the first embodiment, the holding sheet in the inner region is sagged after the preparing step but before the setting step, in particular, by adhering the frame 2 on the peripheral region 3a of the holding sheet 3 and then stretching the holding sheet 3. In this instance, the holding sheet in the inner region may be sagged before or after the substrate holding step.

First Embodiment

Figure 3:
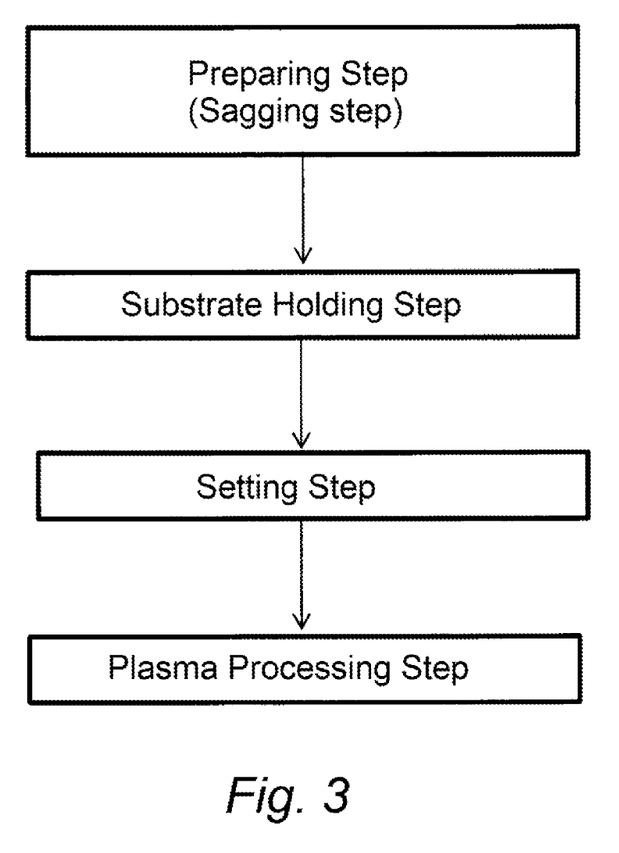
FIG. 3 is a flowchart depicting some steps of the plasma processing method according to a first embodiment of the present invention.

As mentioned above, the holding sheet in the inner region is sagged in the preparing step by applying the frame 2 with the biasing force in the radial direction for stretching it, adhering the frame on the holding sheet in the peripheral region thereof, and releasing the biasing force from the frame. FIG. 3 is a flowchart illustrating the plasma processing method according to the present embodiment.

[1. Preparing Step (Sagging Step)]

Firstly, the conveying carrier 10 is prepared. The conveying carrier 10 is obtained by adhering and securing the frame 2 on the adhesive side of the holding sheet 3. For example, the holding sheet 3 wound in a roll is pulled out, in which the adhesive side 3X of the holding sheet 3 opposes the frame 2, covering the opening of the frame 2 seated on a pedestal (not shown), and is secured by adhesion on one side of the frame 2.

In this step, the frame 2 seated on the pedestal is applied with a biasing force in a radial direction for expansion or stretching, and is adhered on the holding sheet 3. Then, the biasing force is released to render the holding sheet 3 to sag in the inner region 3b.

Figure 4:
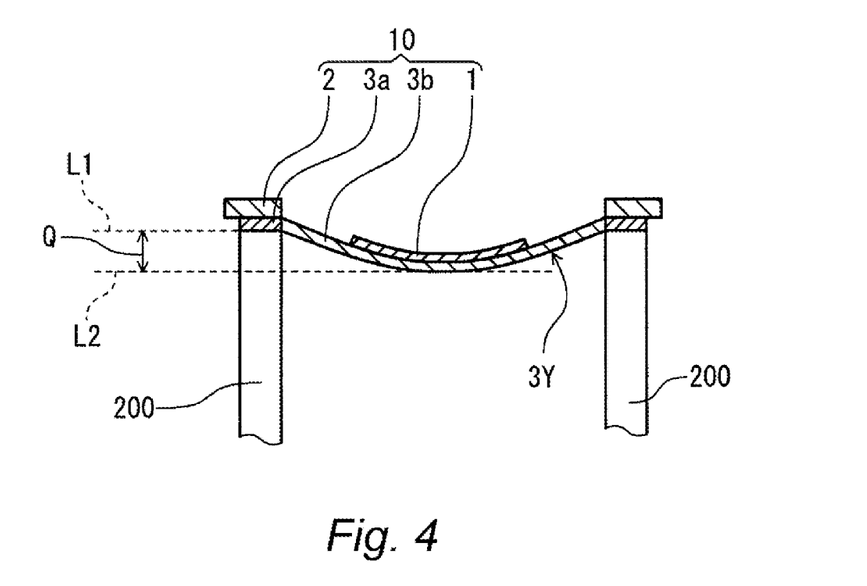
FIG. 4 is a conceptual cross-sectional view illustrating a sag Q of a holding sheet.

As illustrated in FIG. 4, the sag amount Q of the holding sheet 3 in the inner region 3b is one of the holding sheet 3 holding the substrate 1 just before a setting step which will be described later. The sag amount Q of the holding sheet 3 is designed appropriately in accordance with several parameters such as a diameter of the frame 2, a diameter and a thickness of the substrate 1, and a thickness of the holding sheet 3. For example, when the diameter of the frame 2 is about 300 mm, the diameter of the substrate 1 are 150 mm, the thickness of the substrate 1 is 100 and the thickness of the holding sheet 3 is 110 the sag amount Q of the holding sheet 3 in the inner region 3b may be between 80 µm and 1000 µm.

The sag amount Q may be defined as follows. The conveying carrier 10 is supported at the peripheral regions 3a on upper ends of a plurality of rod members 200 so that the holding sheet 3 is floated away from a horizontal surface as shown in FIG. 4. In a cross-section extending through the center of the inner region 3b of FIG. 4, the sag amount Q may be defined as the minimum distance between the line L1 extending on the non-adhesive side 3Y at the peripheral region 3a and a tangential line L2 at the portion of the holding sheet 3 which sags deepest. The minimum distance can be determined, for example, by means of an optical (non-contact type) measuring apparatus. An initial sag amount $Q_0$ which will be described later can also be determined in a similar manner. It should be noted that the sag amount Q is exaggerated in FIG. 4 for clear illustration.

The sag amount Q may be determined within the vacuum chamber 103. In this instance, the conveying carrier 10 is set on upper ends of the supporting members 122 which are raised at a level such that the holding sheet 3 is floated away from the stage 111, and the sag amount Q can be determined as the minimum distance as described above.

In the meanwhile, the frame 2 may be distorted due to deviation and/or tolerance in manufacturing thereof and wear by repeated use in a production line. Thus, the sag amount Q and the initial sag amount $Q_0$ of the holding sheet 3 contain a distortion amount R of the frame 2. When the frame 2 is distorted (i.e., the distortion amount R is positive >0), the sag amount Q is controlled to be greater than the distortion amount R. This allows the contact between the stage 111 and the holding sheet 3 first in the inner region 3b then in the peripheral region 3a, regardless the distortion of the frame 2.

Figure 5:
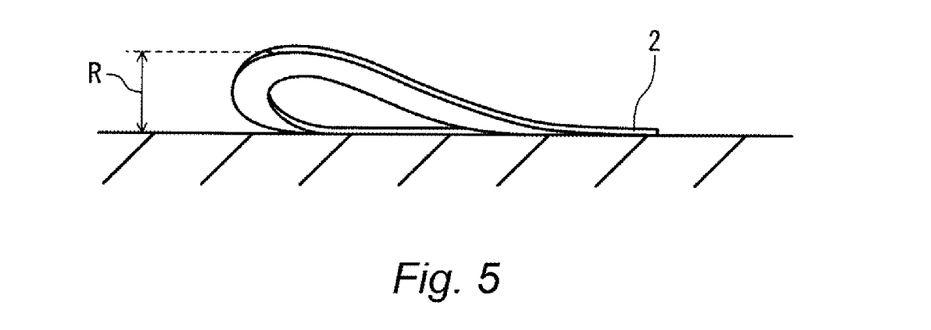
FIG. 5 is a conceptual side view illustrating a distortion R of a frame.

The distortion amount R may be determined as follows. When the frame 2 (or the conveying carrier 10) alone is seated on a flat surface as illustrated in FIG. 5, the distortion amount R is defined as the distance between the most floating portion of the frame 2 and the flat surface. It should be noted that the distortion amount R is exaggerated in FIG. 5 for clear illustration.

[2. Substrate Holding Step]

The substrate 1 is adhered on the adhesive side 3X of the holding sheet 3 so that the substrate 1 is held on the conveying carrier 10. For example, when the conveying carrier 10 is seated on the pedestal with the adhesive side 3X facing upward and the substrate 1 may be adhered on the adhesive side 3X. Alternatively, when the substrate 1 seated on the pedestal, the conveying carrier 10 is positioned over the substrate 1, and then the substrate 1 may be adhered on the holding sheet 3.

[3. Delivering Step]

Next, the conveying carrier 10 with the substrate held thereon is delivered into the chamber 103. The cover 124 is elevated at a given level by means of the lifting rods 121 in the vacuum chamber 103. Then, the conveying carrier 10 is delivered or loaded into the vacuum chamber 103 from a load lock chamber (not shown). A plurality of the supporting members 122 are kept at the elevated position. When the conveying carrier 10 is delivered to a given position above the stage 111, it is passed onto the supporting members 122. The conveying carrier 10 is seated on the top end of the supporting members 122, so that the adhesive side 3X of the holding sheet 3 faces upward.

[4. Setting Step]

After the conveying carrier 10 is passed onto the supporting members 122, the vacuum chamber 103 is kept in a hermetically sealed condition, and the supporting members 122 are lowered. When the top ends of the supporting members 122 are lowered to the level same as or lower than the level of the stage 111, the conveying carrier 10 is set on the stage 111. In this step, the holding sheet 3 in the inner region 3b contacts the stage 111 prior to the holding sheet 3 in the peripheral region 3a.

Subsequently or simultaneously with the supporting members 122 lowered, the lifting rods 121 are driven to lower the cover 124 to a predetermined level. The distance or gap between the cover 124 and the stage 111 is adjusted so that the each of the biasing members 107 provided on the cover 124 achieves a point contact with the frame 2. Thus, the frame 2 is pushed down by the biasing members 107, and the cover 124 overlaps the frame 2 and a region of the holding sheet 3 outside the substrate 1 so that the substrate 1 is exposed in the window 124W of the cover 124.

The cover 124 is, for example, doughnut-shaped having a substantially circular outline, and a having constant width and thickness. The inner diameter of the cover 124 (i.e., a diameter of the window 124) is smaller than the inner diameter of the frame 2, and the outer diameter of the cover 124 is greater than the outer diameter of the frame 2. Therefore, when the conveying carrier 10 is set on the stage at a predetermined position and the cover 124 is lowered, the cover 124 overlaps the frame 2 and at least a partial region of the holding sheet 3. Also, at least a portion of the substrate 1 is exposed by the window 124W. When the holding sheet 3 is sagged, crimps may be formed at the peripheral region 3a thereof upon setting the conveying carrier 10 on the stage 111 as will be described later. However, since the peripheral region 3a of the holding sheet 3 is overlapped by the cover 124, thermal increase and abnormal discharge on the holding sheet 3 is suppressed during the plasma processing step. The cover 124 may be made of material, including for example, a ceramic such as alumina and aluminum nitride (AlN), a dielectric such as quarts, and a metal such as aluminum with/without an anodic oxidation coating.

[5. Securing Step]

The holding sheet 10 held on the stage 111 is secured or stuck on the stage 111. When the stage 111 is provided with the ESC electrode 119, the ESC electrode 119 is applied with the voltage to generate the sticking force between the holding sheet 3 of the conveying carrier 10 and the stage 111, thereby to secure the holding sheet 3 and the conveying carrier 10 on the stage 111. By securing the substrate 1 on the stage 111, the crimps formed by the sags of the holding sheet 3 can be controlled to be adjacent to the peripheral region 3a. As described above, since the peripheral region 3a is overlapped by the cover 124, thermal increase and abnormal discharge on the holding sheet 3 is suppressed during the plasma processing step.

Meanwhile, the voltage application to the ESC electrode 119 may be initiated before the top ends of the supporting members 122 are lowered to the level same as or lower than the level of the stage 111. For example, the voltage application to the ESC electrode 119 may be initiated before the inner region 3b of the holding sheet 3 is in touch with the stage 111, or after the peripheral region 3a of the holding sheet 3 is in touch but before the inner region 3b thereof is in touch with the stage 111. Also, the voltage application to the ESC electrode 119 may be initiated, after the top ends of the supporting members 122 are lowered to the level same as or lower than the level of the stage 111 and at least a portion of the peripheral region 3a of the holding sheet 3 touches the stage 111.

[6. Plasma Processing Step]

The substrate 1 undergoes the plasma processing step. In the plasma etching step, a processing gas is introduced from a processing gas source 112 through a gas inlet 103a into the vacuum chamber 103. On the other hand, a decompressing mechanism 114 is used for evacuating the gas within the vacuum chamber 103 to maintain the pressure therein at a constant pressure. Then, the first electrode 109 is supplied with the high-frequency power from the high-frequency power source 110A to generate the plasma atmosphere within the vacuum chamber 103. The plasma atmosphere is comprised of ions, electrons, and free radicals. The substrate 1 is removed or etched by a physicochemical reaction with the plasma atmosphere, from a top surface through a bottom surface in a region uncovered by a resist layer formed thereon so that the substrate 1 is individualized or diced into a plurality of element chips.

The plasma processing step may be initiated a predetermined time past after the setting step. The stage 111 is typically cooled down, e.g., at a temperature between minus 10 degrees C. and minus 20 degrees C. After setting the conveying carrier 10 holding the substrate 1 on the stage 111 and keeping it still in contact therewith for a given time period, both of the holding sheet and the substrate 1 reach a stable temperature, which facilitate evenly etching the substrate 1 in the plasma processing step. Although not limited thereto, the given time period may be between 60 and 120 seconds. The conveying carrier 10 may be kept in contact with the stage 111 before or after the setting step.

The conveying carrier 10 holding the substrate 1 may be set on the stage 111 and kept still in contact therewith, and then the substrate 1 may be secured on the stage 111 by applying the ESC electrode 119 with a voltage, and then treated by a plasma exposure.

The conveying carrier 10 holding the substrate 1 may be set on the stage 111 and secured on the stage 111 still for a given time period by applying the ESC electrode 119 with a voltage, and then the substrate 1 may be treated by a plasma exposure.

After the securing step and before the plasma processing step, a coolant gas such as helium, argon, and nitrogen may be introduced between the stage 111 and the holding sheet 3 to accelerate cooling of the holding sheet 3. The coolant gas may be introduced a predetermined time period after the securing step. The cooling efficiency is improved, by introducing the coolant gas after the substrate 1 is securely fixed on the stage 111.

The second electrode 120 may be applied with the high-frequency power having a high frequency of 100 kHz or more, from the second high-frequency power source 110B. The energy of the ions impinging to the substrate 1 may be controlled by the high-frequency power applied to the second electrode 120 from the second high-frequency power source 110B. The high-frequency power applied to the second electrode 120 defines the biasing potential on the surface of the stage 111, which in turn accelerates the impinging ions towards the substrate 1, thereby to increase the etching rate.

The etching conditions may be selected appropriately in accordance with the material of the substrate 1, for example. In a case that the substrate 1 is made of silicon (Si) for example, the substrate 1 may be etched by generating the plasma atmosphere in the vacuum chamber 103 with a source material of sulfur hexafluoride ($SF_6$). For example, the vacuum chamber 103 may be supplied with the source gas of $SF_6$ at a flow rate of 100-800 sccm so that the pressure therein is controlled between 10-50 Pa. Also, the first electrode 109 may be applied with the high-frequency power having the power between 1000-5000 W and the high frequency of 13.56 MHz or more, and the second electrode 120 may be applied with the high-frequency power having the power between 50-1000 W and the high frequency of 100 kHz or more (for example, between 400-500 kHz, or 13.56 MHz).

The surface of the substrate 1 uncovered by the resist mask may preferably be etched along a vertical direction. In this case, two plasma processing steps may be alternately repeated, including the plasma etching step with the fluorine-based source gas such as sulfur hexafluoride ($SF_6$) as mentioned above, and a protective-layer depositing step for depositing a protective layer with the fluorocarbon source gas such as perfluorocyclobutane (C4F8).

After individualizing or dicing the substrate 1 into the element chips by the etching, an ashing step is implemented. A processing gas used for the ashing step (for example, oxygen gas or mixed gas including oxygen gas and gas containing fluorine) is introduced from an ashing gas source 113 into the vacuum chamber 103. On the other hand, the decompressing mechanism 114 is used to evacuate the gas from the vacuum chamber 103 to maintain the pressure therein at a predetermined level. The high-frequency power is supplied from the first high-frequency power source 110A to generate the oxygen plasma atmosphere within the vacuum chamber 103, so that the resist mask is thoroughly removed from the surface of the individualized substrate 1 (electronic components) in the region exposed by the window 124W of the cover 124.

[7. Delivery Step]

After completing the ashing step, the gas in the vacuum chamber 103 is evacuated. The conveying carrier 10 holding the individualized or diced substrate 1 is unloaded from the plasma processing apparatus 100. After the conveying carrier 10 is unloaded, the vacuum chamber 103 is again closed in a hermetically sealed condition. The unloading step of the conveying carrier 10 may be achieved by a procedure opposite to the aforementioned loading or delivery step. Thus, the cover 124 is lifted up to the given position, the power supply to the ESC electrode is cut off to release the conveying carrier 10 from the stage 111, and then the supporting members 122 are moved upward. After the supporting members 122 are moved up to the given level, the conveying carrier 10 is unloaded from the vacuum chamber 103.

Second Embodiment

Figure 6:
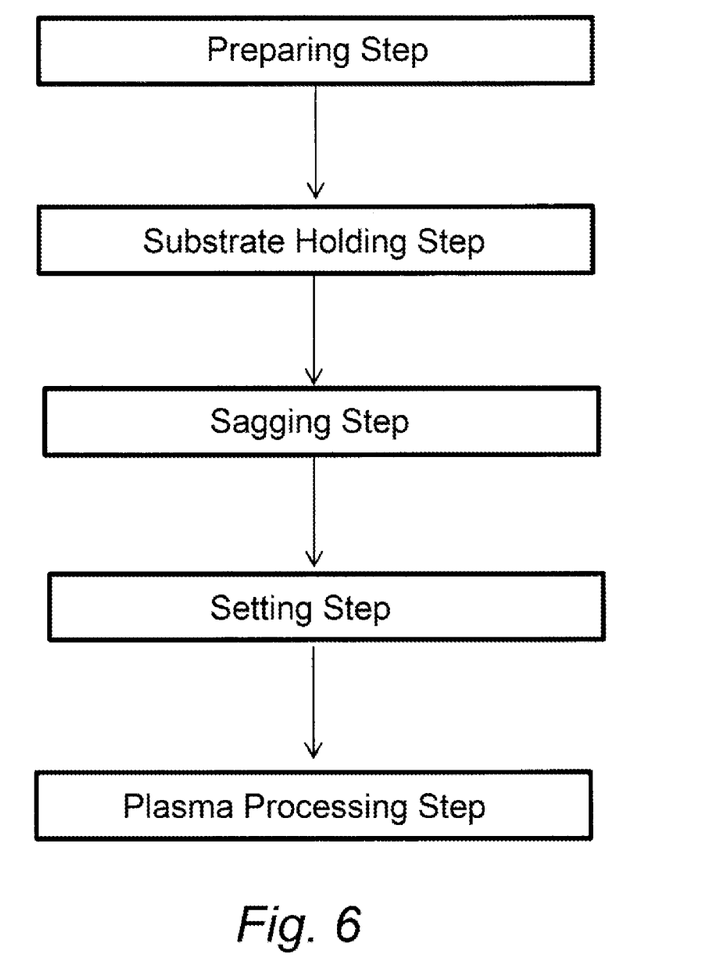
FIG. 6 is a flowchart depicting some steps of the plasma processing method according to a second embodiment of the present invention.

The present embodiment is similar to the first embodiment except that the sagging step is achieved by stretching the holding sheet 3 adhered on the frame 2 after the substrate holding step and before the setting step. FIG. 6 is a flowchart depicting some steps of the plasma processing method according to the second embodiment of the present invention. Nonetheless, it should be noted that the sagging step may be achieved after the preparation step and before the substrate holding step.

The way of stretching the holding sheet 3 is not limited to a particular one. For example, the holding sheet 3 may be biased by pushing the inner region 3b with use of a jig for stretching the holding sheet 3, or may be heated for stretching it. It is preferable to heat the holding sheet 3 so as to stretch it without a necessity of the special tool (jig).

The heating condition of the holding sheet 3 is not limited to a particular one, and may be selected appropriately according to material and thickness of the holding sheet 3. However, in order to prevent the holding sheet 3 from being damaged, preferably it is heated so that the surface thereof is kept between 50-60 degrees C. The way of heating the holding sheet 3 is not limited to a particular one, after the holding sheet 3 is seated on the pedestal, it may be heated by a heating device arranged over the holding sheet 3, or by a hot plate positioned beneath the holding sheet 3.

The sagging step is achieved by heating the holding sheet 3 within the plasma processing apparatus 100. In this instance, after the conveying carrier 10 is passed onto the supporting member, the holding sheet 3 is heated during a time window before the supporting member 122 is lowered to the level same as or lower than the level of the stage 111.

The holding sheet 3 after the substrate holding step and before the sagging step may already have an initial sag due to its weight and mass of the substrate 1. The initial sag $Q_0$ may be for example in a range between about 50-800 μm. In this case, the holding sheet 3 is stretched so that the sag amount Q in the inner region 3b is greater than the initial sag $Q_0$.

REFERENCE NUMERALS

1: substrate, 2: frame, 2a: notch, 2b: corner cut, 3: holding sheet, 3X: adhesive side, 3Y: non-adhesive side, 3a: peripheral region, 3b: inner region, 10: conveying carrier, 100: plasma processing apparatus, 103: vacuum chamber, 103a: gas inlet, 103b: gas outlet, 107: biasing member, 108: dielectric member, 109: first electrode, 110A: first high-frequency power source, 110B: second high-frequency power source, 111: stage, 112: processing gas source, 113: ashing gas source, 114: decompressing mechanism, 115: electrode layer, 116: metal layer, 117: base member, 118: peripheral member, 119: ESC electrode, 120: second electrode, 121: lifting rod, 122: supporting member, 123A, 123B: lifting mechanism, 124: cover, 124W: window, 125: coolant circulation device, 126: DC power, 127: coolant channel, 128: controller, 129: circumferential ring, 200: rod member

What is claimed is:

1. A plasma processing method, comprising steps of:
   preparing a conveying carrier including a holding sheet and a frame provided on a peripheral region of the holding sheet;
   adhering the substrate on the holding sheet in an inner region inside the peripheral region to hold the substrate on the conveying carrier;
   sagging the holding sheet in the inner region;
   setting the conveying carrier on a stage provided within a plasma processing apparatus to contact the holding sheet on the stage so that the holding sheet in the inner region touches the stage before the holding sheet in the peripheral region does; and
   plasma processing the substrate,
   wherein a sag amount Q of the holding sheet in the inner region is controlled to be greater than a distortion amount R of the frame in the sagging step.

2. The plasma processing method according to claim 1, wherein the sagging step is achieved by stretching the holding sheet.

3. The plasma processing method according to claim 2, wherein the holding sheet is stretched by heating the holding sheet.

4. The plasma processing method according to claim 1, further comprising steps of:
   cooling down the stage; and
   keeping the holding sheet in contact with the stage for a predetermined time period.

5. A plasma processing method, comprising steps of:
   preparing a conveying carrier including a holding sheet and an annular frame provided on a peripheral region of the holding sheet, by applying the frame with a biasing force in a radial direction for stretching it, adhering the frame on the holding sheet in the peripheral region thereof, and releasing the biasing force from the frame, so as to sag the holding sheet in an inner region inside the peripheral region;
   adhering the substrate on the holding sheet in the inner region to hold the substrate on the conveying carrier;
   setting the conveying carrier on a stage provided within a plasma processing apparatus to contact the holding sheet on the stage so that the holding sheet in the inner region touches the stage before the holding sheet in the peripheral region does; and
   plasma processing the substrate.

6. The plasma processing method according to claim 5, wherein a sag amount Q of the holding sheet in the inner region is controlled to be greater than a distortion amount R of the frame in the preparing step.

7. The plasma processing method according to claim 5, further comprising steps of:
   cooling down the stage; and keeping the holding sheet in contact with the stage for a predetermined time period.

\* \* \* \* \*